(12) United States Patent
Novikov et al.

(10) Patent No.: US 10,536,991 B2
(45) Date of Patent: Jan. 14, 2020

(54) BI-POLAR TRIAC SHORT DETECTION AND SAFETY CIRCUIT

(71) Applicant: Multitech Medical Devices USA LLC, Holtsville, NY (US)

(72) Inventors: Lenny Novikov, Cliffside Park, NJ (US); John William Weiss, Oakdale, NY (US)

(73) Assignee: Multitech Medical Devices USA LLC, Holtsville, NY (US)

( * ) Notice: Subject to any disclaimer, the term of this patent is extended or adjusted under 35 U.S.C. 154(b) by 0 days.

(21) Appl. No.: 14/775,929

(22) PCT Filed: Mar. 14, 2014

(86) PCT No.: PCT/US2014/027758
§ 371 (c)(1),
(2) Date: Sep. 14, 2015

(87) PCT Pub. No.: WO2014/152794
PCT Pub. Date: Sep. 25, 2014

(65) Prior Publication Data
US 2016/0037582 A1  Feb. 4, 2016

Related U.S. Application Data

(60) Provisional application No. 61/782,714, filed on Mar. 14, 2013.

(51) Int. Cl.
*H05B 1/02* (2006.01)
*G01R 15/18* (2006.01)
(Continued)

(52) U.S. Cl.
CPC .......... *H05B 1/0202* (2013.01); *G01R 15/18* (2013.01); *G01R 31/42* (2013.01); *H05B 1/0227* (2013.01);
(Continued)

(58) Field of Classification Search
None
See application file for complete search history.

(56) References Cited

U.S. PATENT DOCUMENTS 3,646,577 A * 2/1972 Ernst ................ B23K 3/033
219/238
3,651,753 A * 3/1972 Schmidt .............. A47J 27/62
219/501

(Continued)

FOREIGN PATENT DOCUMENTS

| CN | 102570338 B | 7/2012 | ........... H02B 13/025 |
| WO | 2014152794 A1 | 9/2014 | ............... H05B 1/02 |

OTHER PUBLICATIONS

Triac-Wikipedia.pdf, Wikipedia, search keyword: Triac, 2003 through 2005.*

(Continued)

*Primary Examiner* — Ibrahime A Abraham
*Assistant Examiner* — Gyounghyun Bae
(74) *Attorney, Agent, or Firm* — Pollack, P.C.

(57) ABSTRACT

Disclosed is a safety circuit for disrupting power to a heating element of an appliance to be powered through a solid state switch (Q1), typically a triac, from an AC power source (V1) having a positive half cycle and a negative half cycle for delivering power. A low resistance condition is sensed by detecting either the current through, or voltage across, the solid state switch during the positive half cycle and the negative half cycle of the AC power line, when the solid state AC switch is not actuated. A fault signal is generated to interrupt power to the heating element, preferably by a crowbar circuit opening a fuse, whenever the low resistance condition is detected.

8 Claims, 16 Drawing Sheets

(51) Int. Cl.
*G01R 31/42* (2006.01)
*H05B 3/00* (2006.01)
(52) U.S. Cl.
CPC ......... *H05B 1/0252* (2013.01); *H05B 1/0272* (2013.01); *H05B 3/0019* (2013.01)

(56) References Cited

U.S. PATENT DOCUMENTS

| | | | | |
|---|---|---|---|---|
| 3,873,853 | A * | 3/1975 | Ahmed | G05F 1/445 327/76 |
| 3,903,883 | A * | 9/1975 | Pecina | A61M 16/1075 128/200.21 |
| 3,980,943 | A * | 9/1976 | Cailleux | D06F 37/304 307/39 |
| 4,051,205 | A * | 9/1977 | Grant | A61M 16/1075 128/203.27 |
| 4,151,387 | A * | 4/1979 | Peters, Jr. | F24C 7/02 219/623 |
| 4,291,838 | A * | 9/1981 | Williams | A61M 11/06 128/203.27 |
| 4,485,296 | A * | 11/1984 | Ueda | G05D 23/24 219/212 |
| 4,496,829 | A * | 1/1985 | Black | G05B 11/28 219/216 |
| 4,554,440 | A * | 11/1985 | Lee, Jr. | G05D 23/2401 219/497 |
| 4,677,281 | A * | 6/1987 | Mills | H02H 5/043 219/212 |
| 4,882,782 | A * | 11/1989 | Kimizuka | H02H 7/12 361/100 |
| 5,422,461 | A * | 6/1995 | Weiss | G05D 23/2401 219/212 |
| 5,579,192 | A | 11/1996 | Lee | 361/18 |
| 5,756,969 | A * | 5/1998 | Machino | G03G 15/2039 219/216 |
| 5,758,567 | A * | 6/1998 | Van Der Wal | A47J 37/0871 219/445.1 |
| 5,770,836 | A * | 6/1998 | Weiss | H05B 1/0272 219/212 |
| 5,847,555 | A * | 12/1998 | Lewis | H02M 5/2573 323/235 |
| 6,111,230 | A * | 8/2000 | Cao | G03G 15/2003 219/216 |
| 6,680,641 | B1 | 1/2004 | Orr | 327/432 |
| 7,189,949 | B1 * | 3/2007 | Bush | B41J 2/04563 219/216 |
| 7,485,832 | B2 | 2/2009 | Wang | 219/482 |
| 8,511,305 | B2 * | 8/2013 | Liu | A61M 16/1075 128/204.17 |
| 8,739,780 | B2 * | 6/2014 | Tang | A61M 16/0051 128/203.14 |
| 2001/0008236 | A1 | 7/2001 | Allard | 219/481 |
| 2005/0263518 | A1 * | 12/2005 | Weiss | G01K 3/005 219/482 |
| 2006/0006165 | A1 * | 1/2006 | Yu | H05B 1/0272 219/482 |
| 2006/0196868 | A1 * | 9/2006 | Yang | H05B 1/0272 219/505 |
| 2006/0255746 | A1 | 11/2006 | Kumar et al. | 315/209 |
| 2009/0303642 | A1 | 12/2009 | Williams et al. | 361/42 |
| 2010/0193503 | A1 * | 8/2010 | Kim | H05B 3/56 219/494 |
| 2010/0201273 | A1 | 8/2010 | Thirugnanasambandham | 315/127 |
| 2012/0168407 | A1 | 7/2012 | Delfino et al. | 218/158 |
| 2012/0169240 | A1 * | 7/2012 | Macfarlane | H02M 1/4225 315/152 |
| 2012/0199574 | A1 | 8/2012 | Weiss et al. | 219/481 |
| 2013/0015174 | A1 * | 1/2013 | Kohn | H05B 1/0272 219/209 |
| 2013/0134149 | A1 * | 5/2013 | Weiss | H05B 1/02 219/481 |
| 2014/0167728 | A1 * | 6/2014 | Liu | G05F 1/455 323/318 |

OTHER PUBLICATIONS

Revision History.pdf, Wikipedia, Revision History, 2003 through 2005.*
Supplementary European Search Report and Opinion dated Jan. 23, 2017—regarding EPO Appln. No. 14771160.0.
Written Opinion of the International Searching Authority dated Jul. 21, 2014—regarding Int'l. Appln. No. PCT/US2014/027758.

* cited by examiner

BI-POLAR TRIAC SHORT DETECTION AND SAFETY CIRCUIT

CROSS REFERENCE TO RELATED APPLICATION

This application is based on and claims the benefit of U.S. Provisional Application Ser. No. 61/782,714 filed Mar. 14, 2013.

FIELD OF THE DISCLOSURE

This disclosure relates generally to electrical safety and, more particularly, to circuits for AC operated appliances, for example, though not limited to, heating pads and electric blankets, that use solid state switching circuits to activate a load and assure the integrity of a solid state switching circuit for controlling activation of the load.

BACKGROUND OF THE DISCLOSURE

Heating pads and electric blankets commonly use heating elements powered by AC line voltage, where the temperature of the heating elements is controlled, and the safety continuously monitored, to protect against overheating. Typically, power to the heating element of such devices is switched on by a solid state switch, e.g., a triac. The integrity of the triac is a key factor in the safety of the product. Should a triac fail in a shorted condition, continuous heating and, in turn, overheating can result, with the risk not only of exposure to the user causing him/her to possibly suffer burns, but also the chance of a fire. It is, therefore, important to detect a shorted power switch condition and disconnect the power before allowing an unsafe condition to develop.

Using multiple circuits in a heating element of a heating pad or electric blanket, it has been found, provides better detection of overheating due to a larger portion of the heating wire being affected by a bunch condition. In this manner, overheating can often be recognized sooner by the temperature control circuitry.

U.S. Pat. No. 5,420,397 to Weiss, for instance, discloses a safety circuit for a positive temperature coefficient (PTC) heater wire that detects a break in the wire, and quickly turns the power off before an arc can cause the wire, which is highly flammable, to catch fire. The circuit uses a triac to switch the power on and off in time proportion relative to the heat setting. In one embodiment, two triacs are used in series to mitigate the effect of one of the triacs failing by becoming shorted, inasmuch as the other of the two triacs would disrupt the power. In another embodiment, a second triac is used in a crowbar circuit to open the power fuse in the event that power to the PTC wire is detected during the "off" state of the power control triac.

Heating pads and electric blankets usually have higher wattage than is needed to stabilize at the desired temperature. The extra power is typically provided to quickly bring the surface of the heating pad or electric blanket up to the desired temperature. Such is termed a "preheat mode" which drives the heater wire to a higher temperature for a short period of time. After cessation of the preheat mode, a controller measures the temperature and maintains the wire at a target temperature according to a setting selected by the user. In this case, the power required to maintain the desired temperature may be as little as 20% of the total available power. A solid state switch, commonly a triac, can fail by becoming shorted in either a full wave or half wave condition. Even a failure in the half wave condition could continuously provide 50% of the power and eventually result in overheating of the heating element. While attempts have been made to detect a triac short in the positive half cycle only, such attempts, it has been found, often leave the circuit vulnerable to a situation where the triac may be shorted in the negative half cycle, and a runaway temperature could result.

Appliances other than heating pads and electric blankets have heating elements powered from an AC line and use triacs to switch the power on and off to control temperature by connecting the heating element to AC power when the temperature is below a preset value, and disconnecting the heating element from the AC power when the required temperature is reached. Other types of AC operated appliances use electronic AC switches to operatively connect and disconnect power to the load. Failure resulting from a shorted electronic power switch (e.g., a triac) in such appliances can also lead to an unsafe and uncontrollable temperature rise in the heating element, or other unsafe conditions.

In microcontroller (MCU) based circuits, an MCU is used to measure temperature of the heater wire and provide a control signal for the triac. These MCU circuits are quite often powered by a non-isolated low voltage power supply connected to the power line, providing just a single polarity DC voltage, e.g., +5V. Having a single polarity power supply provides obstacles for direct detection of the opposite polarity or bipolar signals.

In situations where a heating pad (or other appliances having a heating element powered from an AC line) is used, it has been found advantageous to use two circuits, where one circuit is powered by the positive half cycle of the AC power line, typically 120 VAC, and the other circuit is powered by the negative half cycle of the AC power line, as described in U.S. Patent Application Publication No. US 2013/0134149A1 to Weiss. Heating elements typically used have positive temperature coefficient characteristics, for example, when nickel is used, and the temperature is determined by the measured resistance of both circuits. A first circuit resistance is measured during the positive half cycle of the AC power line, and a second circuit resistance is measured during the negative half cycle. The requirement that the resistance be measured in the negative half cycle for the second circuit has, in turn, led to a requirement that conduction of the triac be determined both as to when power should be applied and when power should not be applied. Conductance of the triac when the power should not be applied is indicative of a triac short. Triacs can be shorted for either the positive or negative half cycles of the AC line, or even for both cycles. For single circuit and multiple circuit heating pads, the omission to detect AC switch failure for either half cycle may lead to the power generated during that cycle being applied to the heating element, and cause overheating.

The same principles apply generally to other types of the electronic AC switches, e.g., MOSFET based AC switches, BJT based AC switches, thyristor based AC switches, triac equivalents, etc.

With an appropriate circuit arrangement, the MCU can detect failures and shut down the circuit under certain abnormal conditions, such as overheating, a wire break, or when the triac fails short.

With reference to FIG. 1, which illustrates generally a conventional circuit, MCU U1 triggers triac Q1 to energize heating element or heater HT1 in response to a reading of a temperature sensor (not shown). MCU U1 periodically stops the trigger pulses to evaluate the condition of triac Q1. A Triac Detector circuit 10 comprising a transistor Q2, reverse voltage protection diode D3, current limiting resistor R2 and a load resistor R1, detects the presence of voltage on an MT2 terminal of triac Q1, and outputs a low level to the MCU when voltage is present, and a high level when there is no voltage (triac conducting). The MCU compares the response of the triac detector circuit to the current status of a control signal (trigger) of triac Q1. If the control signal is present, and the triac is expected to conduct current, the MCU expects a high level from the detector. When there is no control signal, the MCU expects a low level from the detector, during the positive half cycle of the power line voltage. Triac short failure is detected when the MCU receives the high level while the triac is not triggered. When such failure is detected, the MCU triggers the crowbar circuit, comprising a triac Qc and a current limiting resistor Rlim, which blows Fuse F1 and disconnects the heater HT1 from the power line.

While useful, the circuit of FIG. 1, is not responsive to a negative voltage at MT2 terminal of triac Q1. The triac, has both negative and positive switching facilities (for positive and negative half cycles of the power line) that can fail independently. However, the circuit of FIG. 1 does not protect against the short failure of the negative cycle control part of triac Q1. Thus, there is a need to provide detection of the triac failure for both the positive and negative half cycles of the power line.

OBJECTS AND SUMMARY OF THE DISCLOSURE

It is, therefore, an object of the disclosure to provide circuitry for an appliance utilizing a heating element powered from an AC power supply, that detects a short in a solid state switch, such as a triac, in both the positive and negative half cycle of the AC power supply so that an appliance utilizing a heating element powered by the positive half cycle and negative half cycle of the AC power supply will be protected from overheating, upon failure of the solid state switching element in either the positive or negative half of the AC cycle.

According to various aspects of the disclosure, a safety circuit is provided for use in disrupting power to a heating element of an appliance to be powered through a solid state switch, typically a triac, from an AC power source having a positive half cycle and a negative half cycle for delivering power. A low resistance condition is sensed by detecting either a current through, or absence of voltage across, the solid state switch during the positive half cycle and the negative half cycle of the AC power line, when the solid state AC switch is not actuated. A fault signal is generated to interrupt power to the heating element, preferably by a crowbar circuit opening a fuse, whenever the low resistance condition is detected.

In one embodiment, the solid state switch is selectively triggered to supply power to the heating element during only a predetermined number of cycles of the applied AC power source, thereby providing a duty cycle limited average to the load. A circuit interrupter in series with the heating element and solid state switch disrupts power to the heating element when a larger current is established, indicating that the solid state switch is passing more than the predetermined number of cycles to the heating element.

According to another embodiment, safety circuits for detecting either current through, or absence of voltage across, the solid state switch during the positive half cycle and negative half cycle of the AC power line, when a solid state AC switch is not actuated, provide a logical fault related signal to an MCU or other logical circuit, which actuates a circuit interrupter, e.g., a crowbar circuit, to disrupt power to the heating element.

In accordance with yet another embodiment, the safety circuits are used with an analog input of an MCU, providing simplified means for detecting either current through, or absence of voltage across, the solid state switch during the positive half cycle and negative half cycle of the AC power line, when a solid state AC switch is not actuated. When a fault condition is detected, the MCU actuates a circuit interrupter, e.g., a crowbar circuit, to disrupt power to the heating element. This embodiment is further adapted for use in a heating appliance with dual heating elements, each formed of a positive temperature coefficient flexible wire and being individually powered through a solid state switch by a respective half cycle of the AC power source, where the bi-polar current detection means are further utilized for independent temperature control of each of the positive half cycle and negative half cycle operated heating circuit.

According to still another aspect of the disclosure, there is provided a safety circuit for use in disrupting power to a heating element of an appliance. The circuit includes an AC power source having a positive half cycle and a negative half cycle for delivering power to the heating element, a solid state switch comprising a triac through which the heating element is powered by the AC power source, a bipolar detection circuit for detecting a low resistance condition in the triac during a positive half cycle of AC power through the triac and detecting a low resistance condition in the triac during a negative half cycle of AC power through the triac to generate a fault signal to interrupt power to the heating element whenever the low resistance condition is detected while the triac is not activated, and a microcontroller unit for receiving the fault signal to activate a crowbar circuit to open a fuse. The detection circuit has a selected electronic component for detecting either levels of voltage across or current through the triac during either the positive or negative half cycle of AC power to generate the fault signal to interrupt power to the heating element when either the voltage or current, respectively, through the triac reaches a predetermined level. The bipolar detection circuit includes an NPN transistor switch responsive to the positive voltage drop across the triac and a PNP transistor switch responsive to the negative voltage drop across the triac, the PNP transistor switch connected to the base of the NPN transistor switch and the bases of the transistors connected to the triac so as to actuate the NPN transistor in response to either positive or negative voltage drop across the triac. In addition, the detection circuit provides a high logical level output to the microcontroller whenever the triac is conducting, and the microcontroller is arranged to generate the fault signal to interrupt power to the heating element if the high logical level is received while the triac is not actuated, whereupon detection by the detection circuit of a short in the triac in either the positive and negative half cycle of AC power and interruption of power to the heating element protects the appliance utilizing the heating element from overheating.

These and other objects, features and advantages of the disclosure are provided by a safety circuit that detects a short in either the positive or negative half cycle of the solid state switching element to initiate a crowbar circuit for increasing current to the fuse through which AC power is supplied to the appliance to open the fuse.

Figure 1:
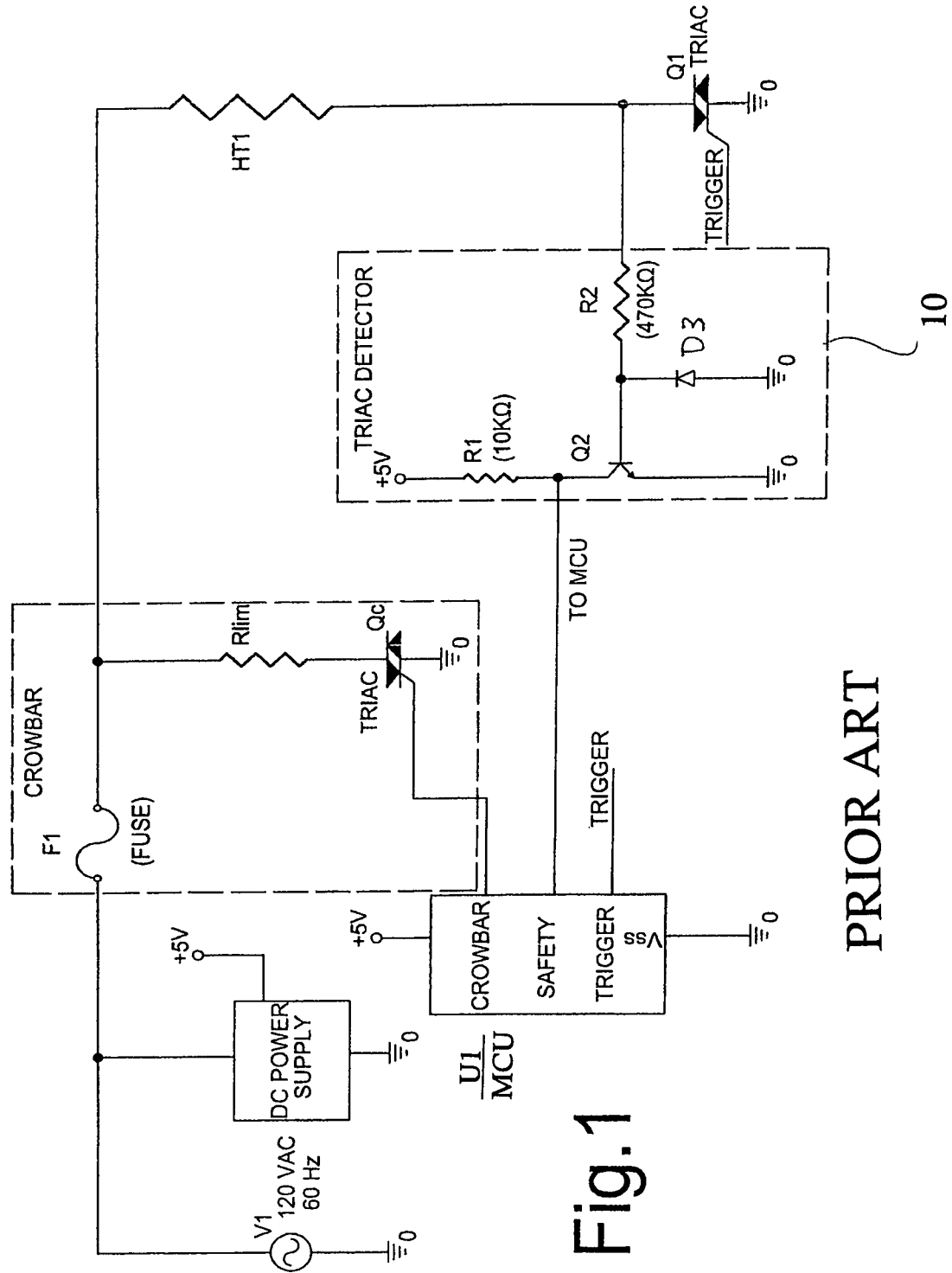
FIG. 1 is a diagram of a conventional circuit for AC switch failure detection, limited to the positive half cycle.

Still other objects and advantages of the disclosures will become apparent from the following description.

DETAILED DESCRIPTION

Referring now to the drawings and, more particularly, to FIGS. 2-15, there is shown generally a specific, illustrative bi-polar triac short detection and safety circuit, according to various aspects of the disclosure. In one embodiment, illustrated generally in FIG. 2, triac detection circuitry 12 detects a short during either half cycle of AC power controlled by a triac to a heating device. A PNP transistor Q3 provides a required negative voltage detection capability. This bi-polar voltage detector operates as follows. When the triac, Q1, is conducting, the voltage drop across the triac is below about 1 Vrms. This voltage is too small to turn on switch Q2. Voltage divider R3 R5 maintains Vbe of Q3 at about 0.15V, which keeps switch Q3 off as well. In this condition, detector output is high. When positive line voltage is present, switch Q2 turns on, and the detector output is low. Diode D2 protects the base of switch Q3 from reverse voltage. When negative line voltage is present, switch Q3 turns on, as does switch Q2; the detector output being low.

Figure 2:
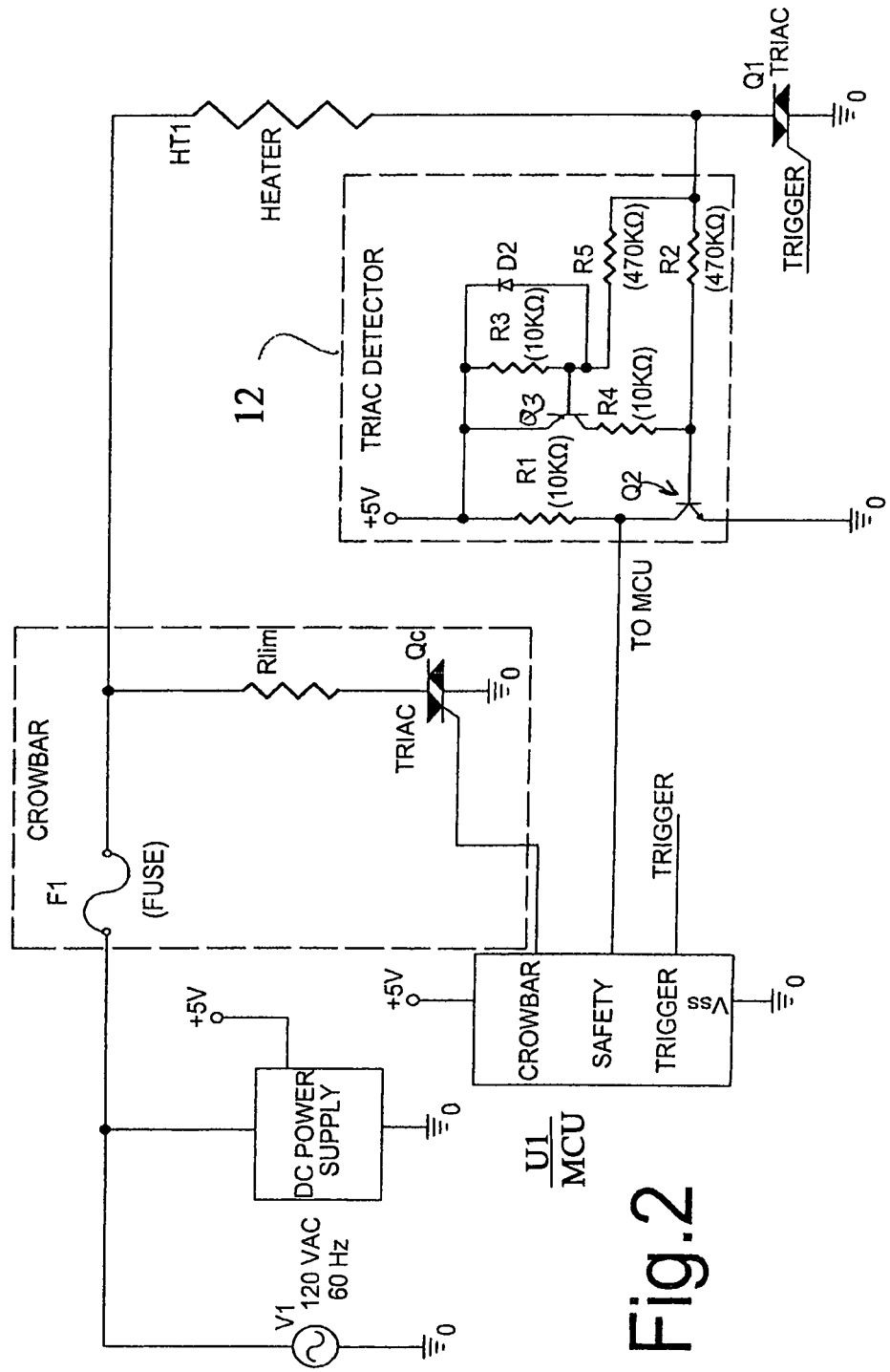
FIG. 2 is a circuit diagram for AC switch failure detection for both AC half cycles by sensing a voltage drop across a solid state switching device, according to one aspect of the disclosure.
Figure 3:
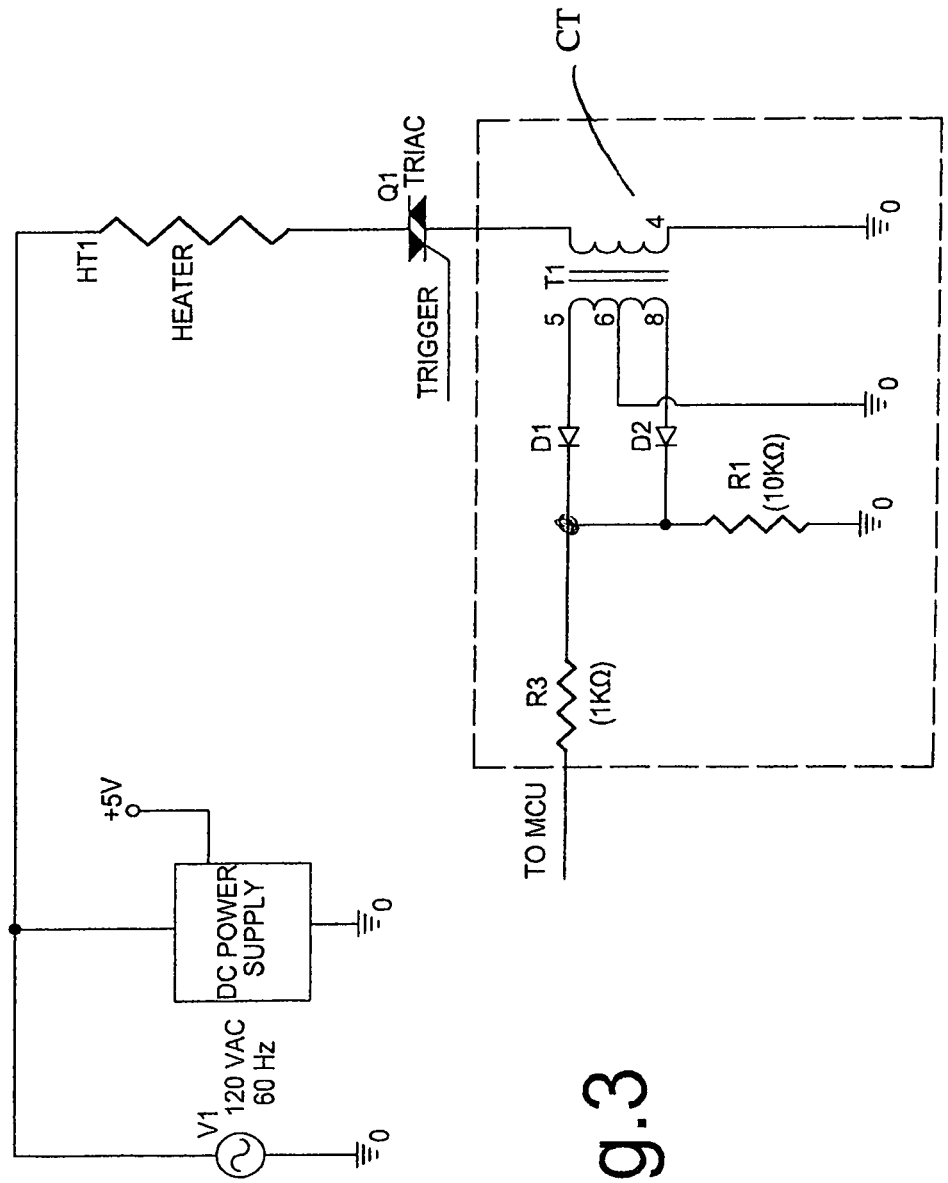
FIG. 3 is a circuit diagram for AC switch failure detection during both AC half cycles by sensing current through a solid state switching device, in accordance with another aspect of the disclosure.

The detector of FIG. 2 detects triac conduction based on voltage drop across the triac.

Another way to detect triac conduction, according to the disclosure, is based on sensing current passing through the triac. The circuit of FIG. 3, for example, shows such a detector, which utilizes a current transformer (CT). This circuit outputs a positive voltage to the MCU when triac Q1 is conducting on either the positive or negative half cycle of the AC power line voltage. In general, the voltage is proportional to the magnitude of current passing through the triac. A CT turn ratio is selected so that the nominal current through the triac creates voltage on the output of the detector corresponding to the high logic level. Resistor R3 limits input current of the MCU at current spikes.

Figure 4:
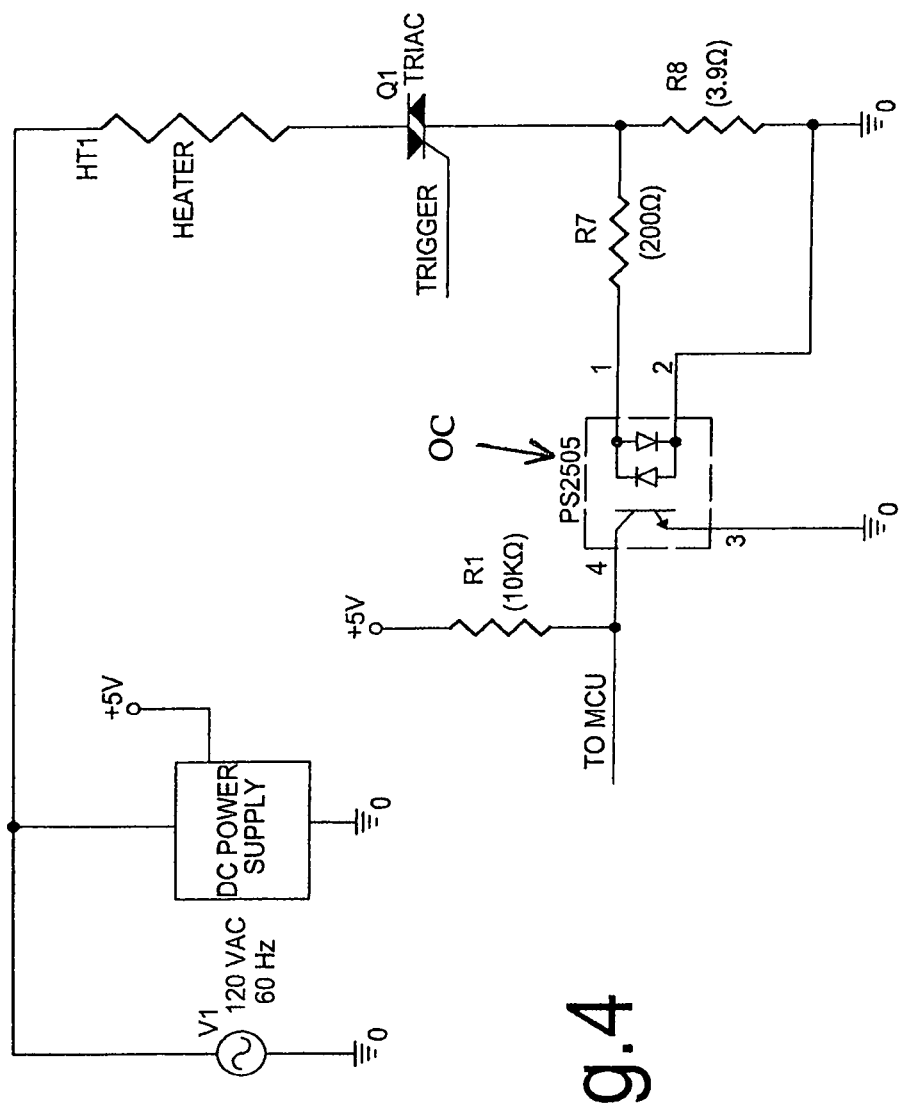
FIG. 4 is a circuit diagram of an alternative circuit for AC switch failure detection during both AC half cycles.

Alternatively or concurrently, an AC optocoupler (OC) enabled circuit, as shown in FIG. 4, provides bi-polar detection of triac Q1 current based on a voltage drop across current sense resistor R8. The output of the circuit is high when the triac is off, and goes low when any polarity current is detected. The values on the schematic correspond to a heater current of about 0.5 Amp.

Figure 5:
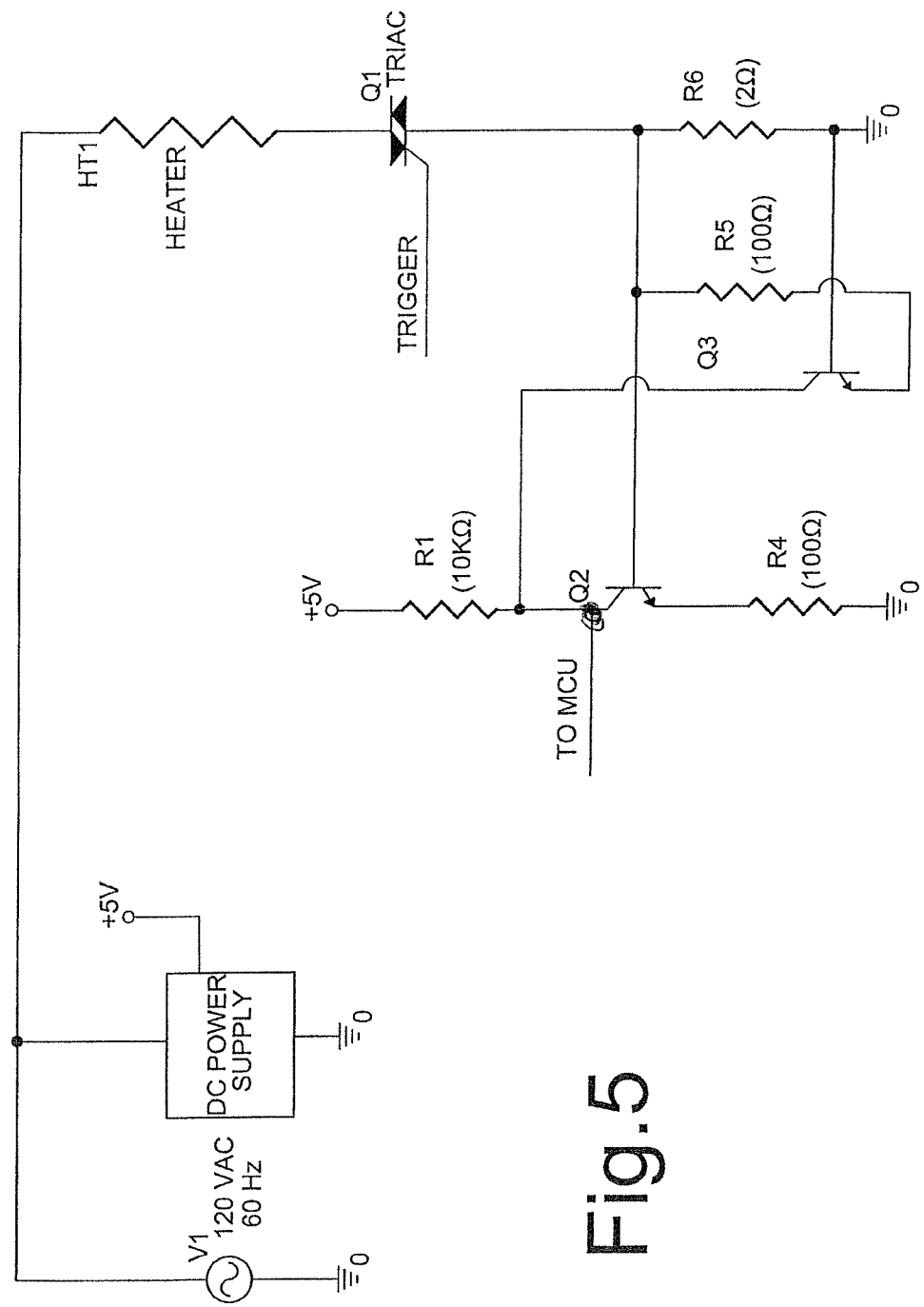
FIG. 5 is a circuit diagram for another alternative circuit for AC switch failure detection during both AC half cycles.
Figure 6:
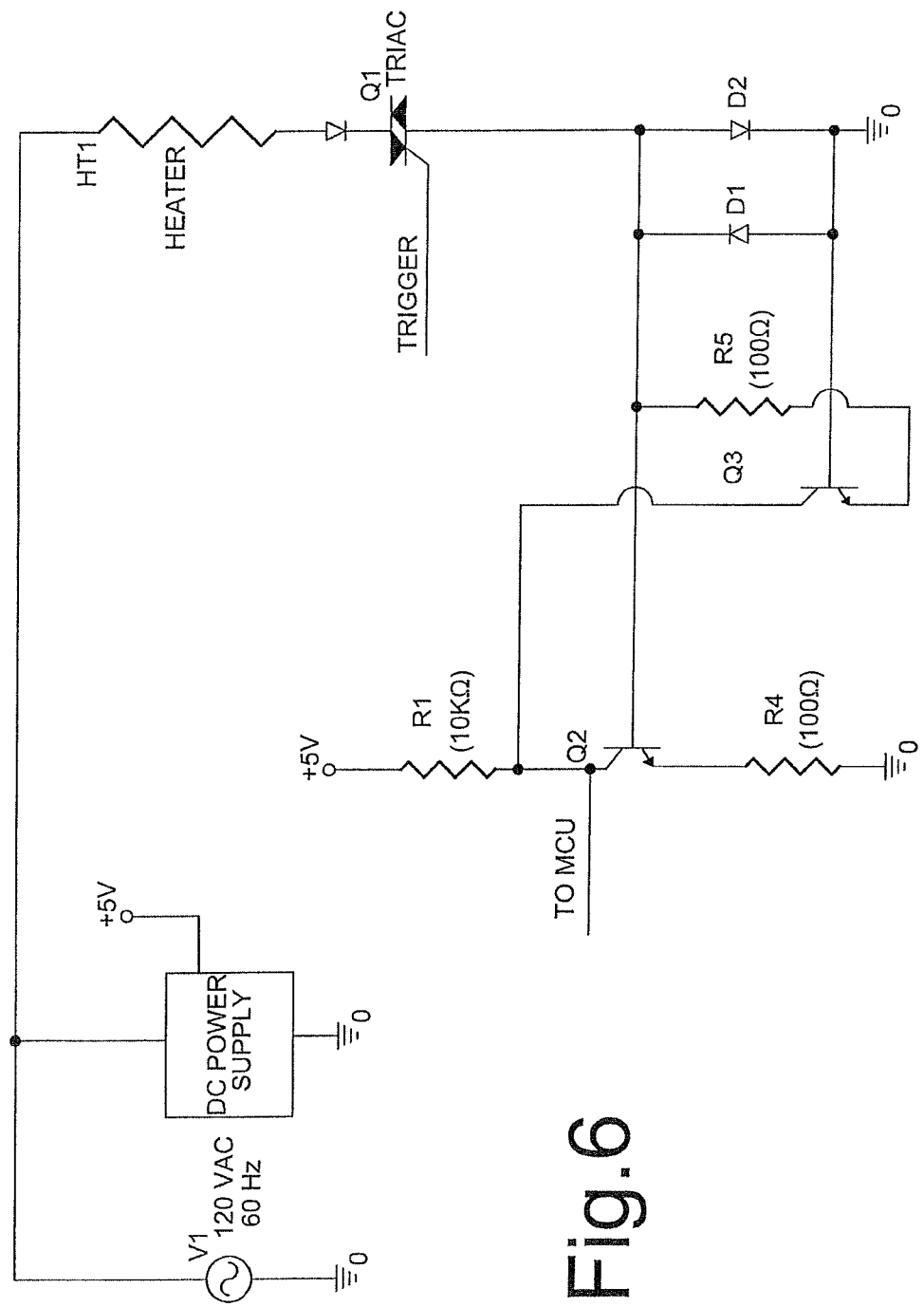
FIG. 6 is a circuit diagram directed to an arrangement for controlling power to a heating element from an AC power source during both AC cycles, according to a further aspect of the disclosure.

Further in the alternative or concurrently therewith, a simple and inexpensive bi-polar current detector is presented according to FIG. 5. This current detector comprises two NPN switches Q2 and Q3 sharing load resistor R1. The output of the circuit is high, when the triac is off. Positive current through a current sense resistor R6 turns switch Q2 on, at which point the output goes low. The output also goes low, when negative current through resistor R6 turns switch Q3 on. Resistors R4 and R5 limit the base currents of the corresponding transistors. The current sense resistor R6 value on the schematic corresponds to a heater current of about 0.5 Amp. The current sense resistor of the circuit of FIG. 5 dissipates about half of the heat of the current sense resistor, according to FIG. 4.

Optionally, an inductor or a capacitor may be used in place of the current sense resistor of FIGS. 4 and 5 to reduce heat generated by the current sense component. To further reduce heat, and make the circuit work on a wide range of currents, the circuit of FIG. 6 uses a pair of inversely paralleled diodes D1 and D2 in place of a current sense resistor.

Generally speaking, the circuits discussed up to this point are designed to work with digital inputs of an MCU or any logic driven protection circuit. Having an analog input available opens up other opportunities for bi-polar voltage and current detection. An on-board or external A-to-D converter (ADC) or a pair of on-board or external analog comparators may be used as an analog input of the MCU or any other logic driven protection circuit.

Figure 7:
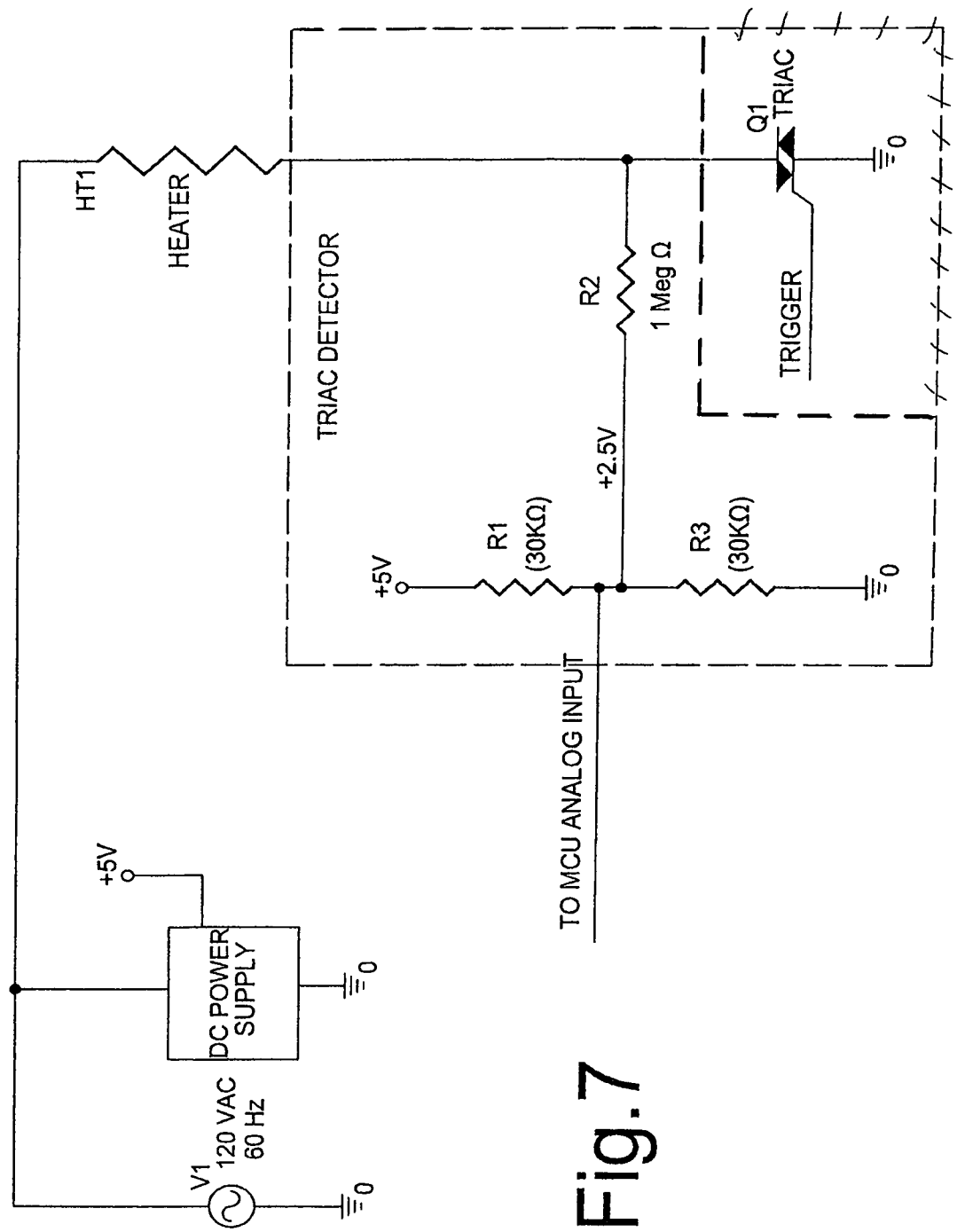
FIG. 7 is a diagram relating to an alternative circuit for AC switch failure detection during both AC half cycles by using analog inputs, in accordance with yet another aspect of the disclosure.
Figure 8:
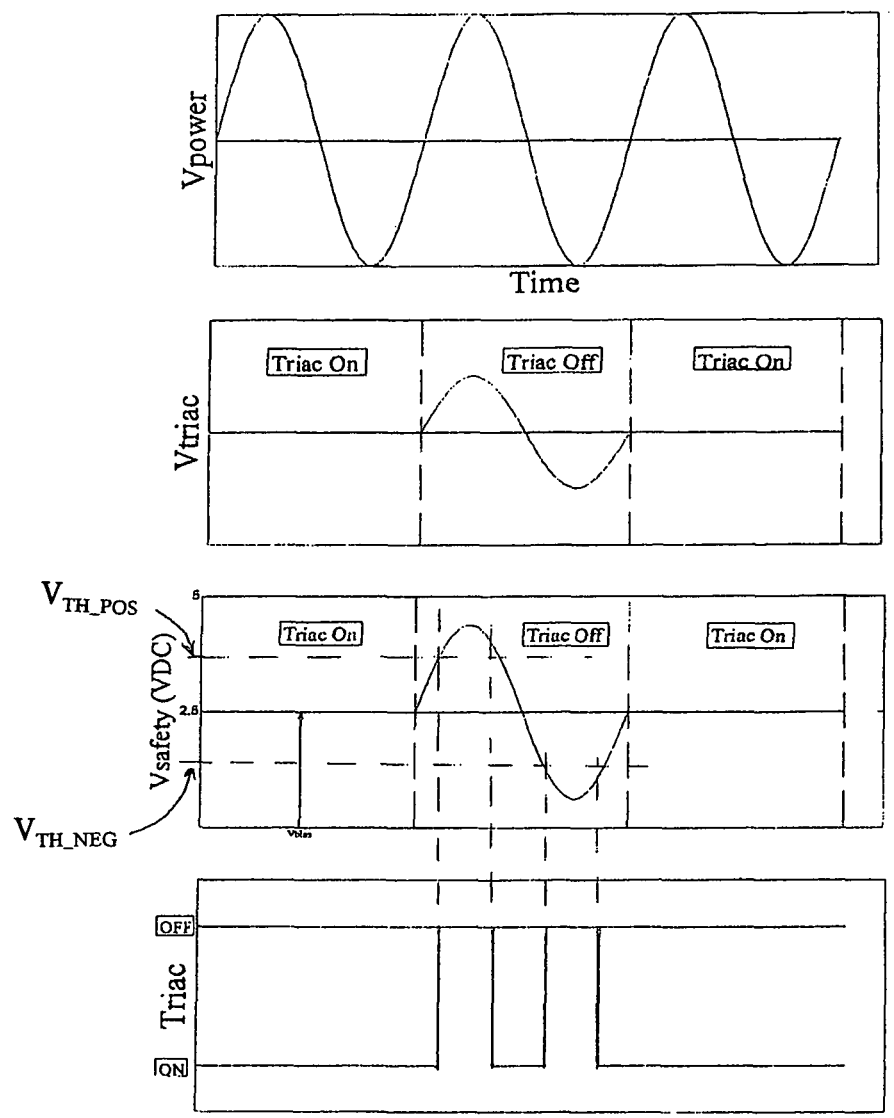
FIG. 8 illustrates the relation of the input analog signals to the logical signals in the MCU of the circuitry shown in FIG. 7.

With analog input, the voltage detector circuit of FIG. 2 can be transformed into a simple arrangement as set forth in FIG. 7. Voltage divider R1 R3 provides a bias for the analog input of the MCU. Resistor R2 together with the bias network forms a voltage divider that scales down the power voltage. As shown in FIG. 8, a voltage comparator or an ADC of the MCU detects the status of triac Q1.

Figure 9:
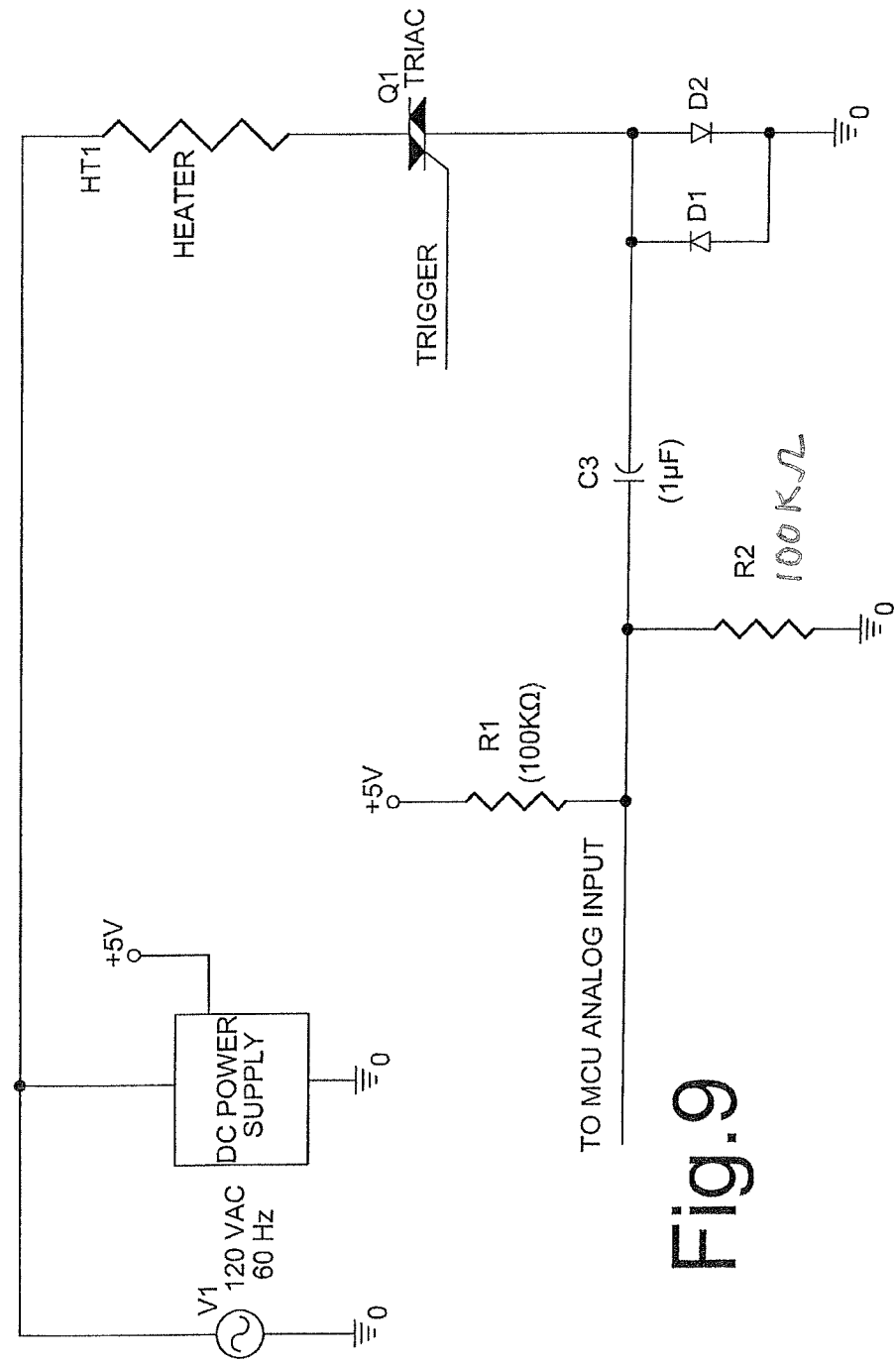
FIG. 9 is a circuit diagram directed to an alternative circuit for AC switch failure detection during both AC half cycles by using analog inputs.
Figure 10:
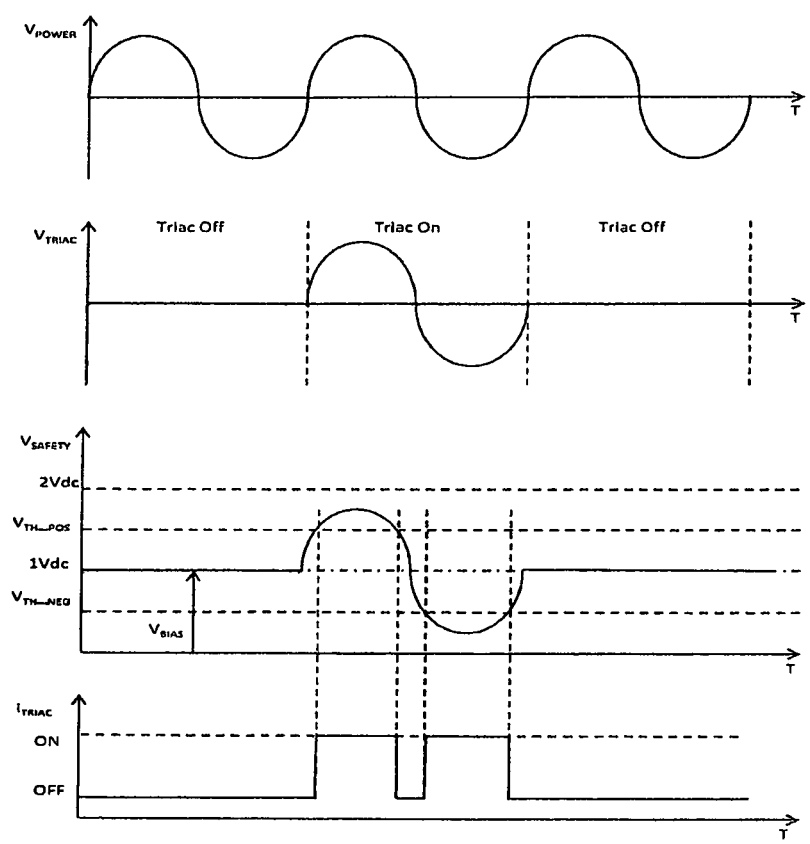
FIG. 10 illustrates signals generated according to the circuit of FIG. 9.

FIG. 9 depicts a bi-polar current detector version for an MCU with an analog input. This circuit features a voltage divider R1 R2 that sets the bias at 1V, and a DC blocking capacitor C3. A voltage comparator or an ADC of the MCU detects the status of triac Q1, as shown in FIG. 10.

Figure 11A:
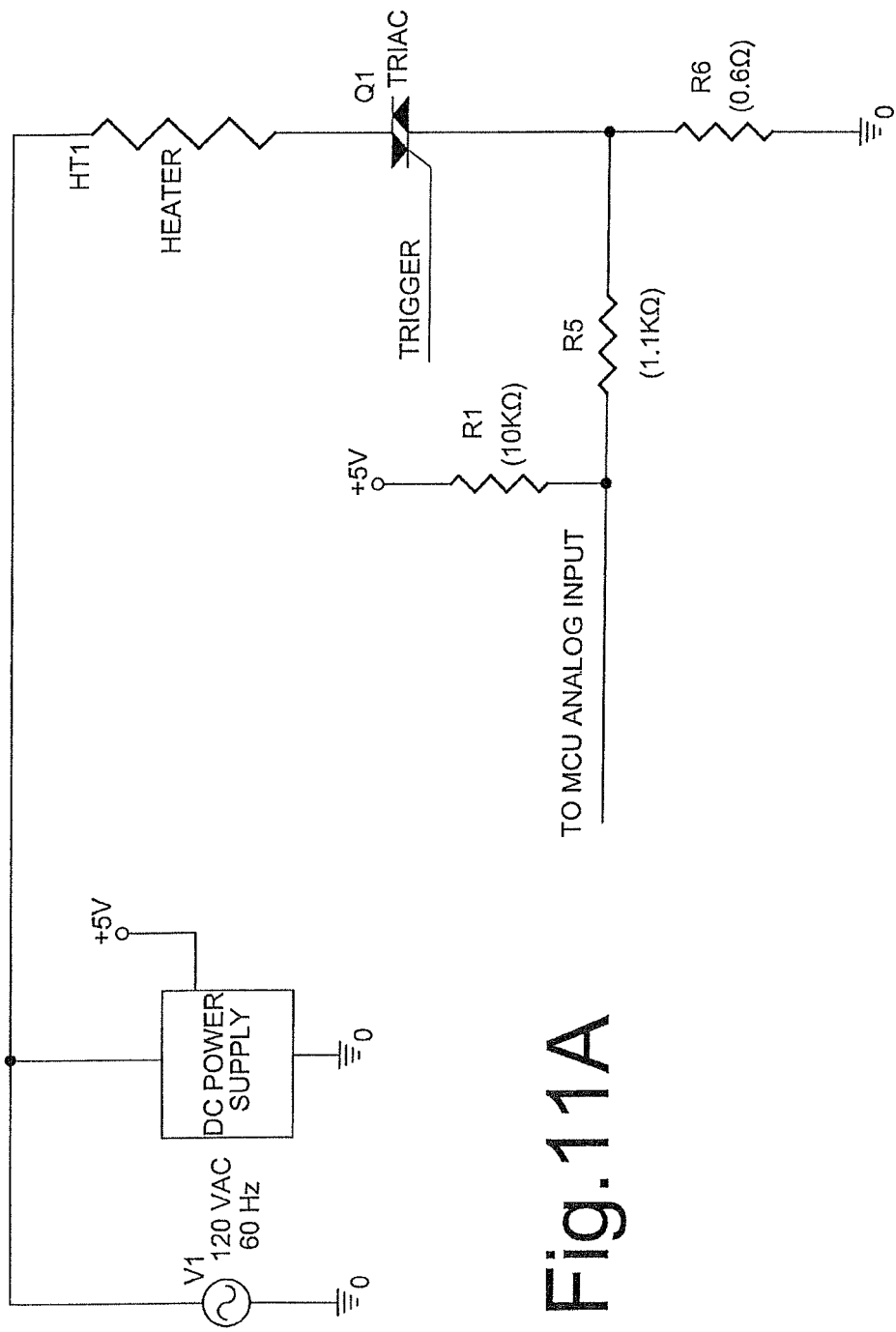
FIGS. 11A and 11B are circuit diagrams relating to a further alternative circuit for controlling power to a heating element from an AC power source during both AC half cycles by analog inputs.
Figure 11B:
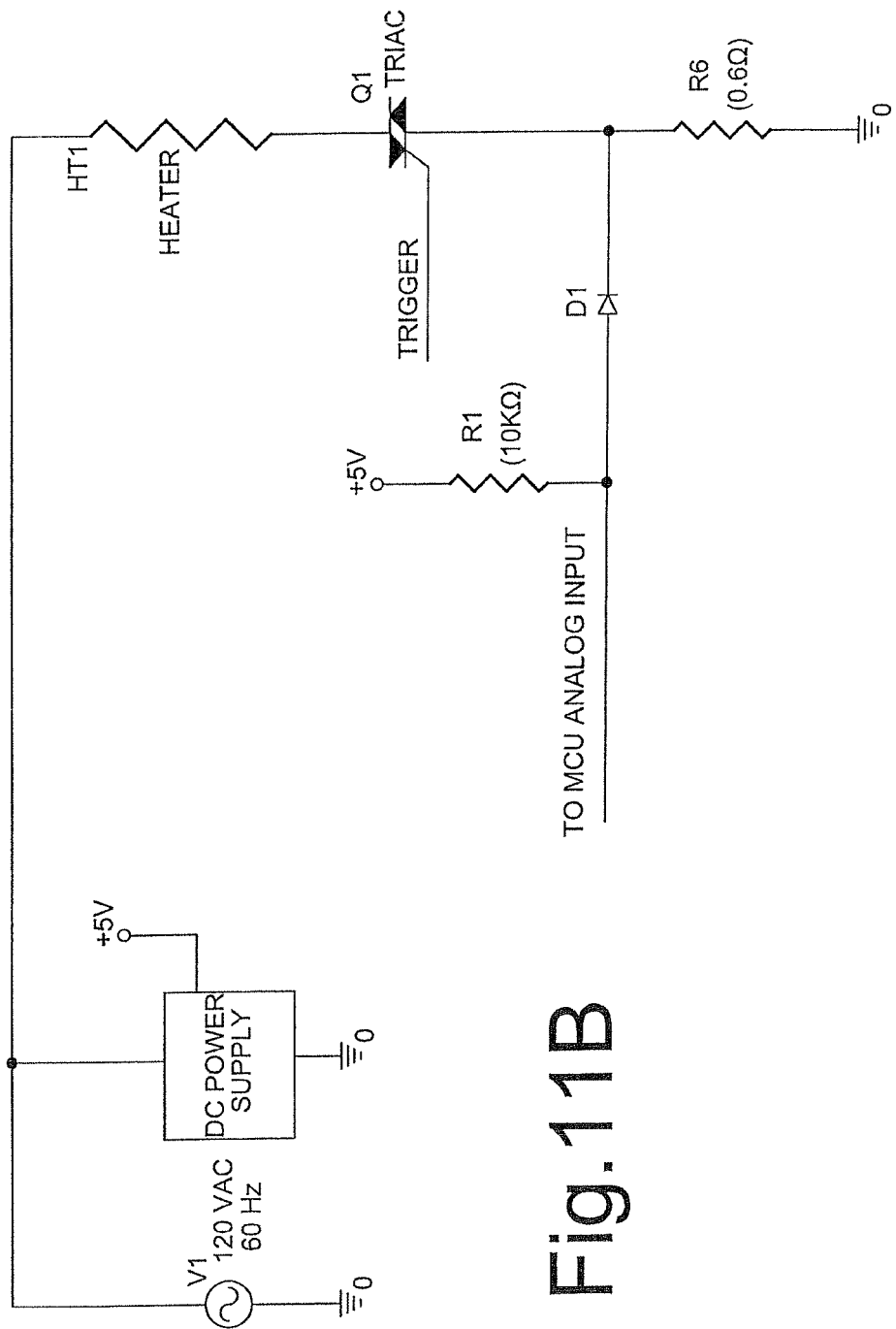

The two circuits shown in FIGS. 11A and 11B demonstrate yet another version of the bi-polar current detector working in conjunction with an analog input of the MCU. Both circuits feature a small value current sense resistor and a bias circuit that shifts a zero at the MCU input up by about 500 mV. The value of the current sense resistor is selected for a heater current of about 0.5 Amp. The circuits work similarly to the detector of FIG. 9.

Bi-polar current detection circuits according to FIGS. 11A and 11B can be used to control the temperature of a heating pad having a heating element by using a positive temperature coefficient (PTC) wire that changes its resistance with temperature. In this manner, bi-polar detection capability enables independent temperature control of each circuit of the dual circuit heating pad, where one circuit is powered by a positive half cycle of the power line, and another circuit by the negative half cycle. An example of such controller is shown in FIG. 12.

Figure 12:
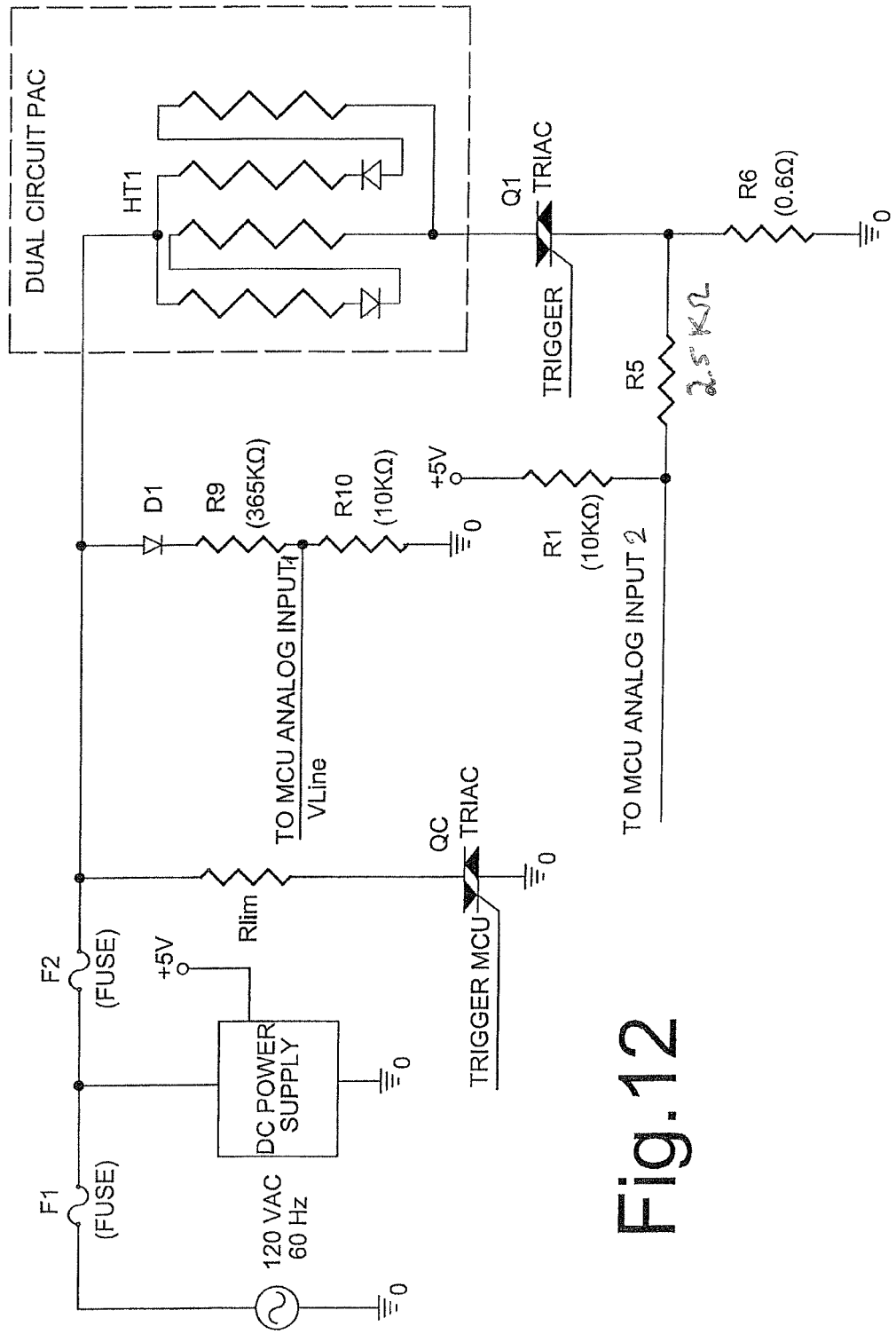
FIG. 12 is a circuit diagram illustrating a preferred circuit for AC switch failure detection during both AC half cycles in a dual circuit heating pad controller, in accordance with still a further aspect of the disclosure.
Figure 13:
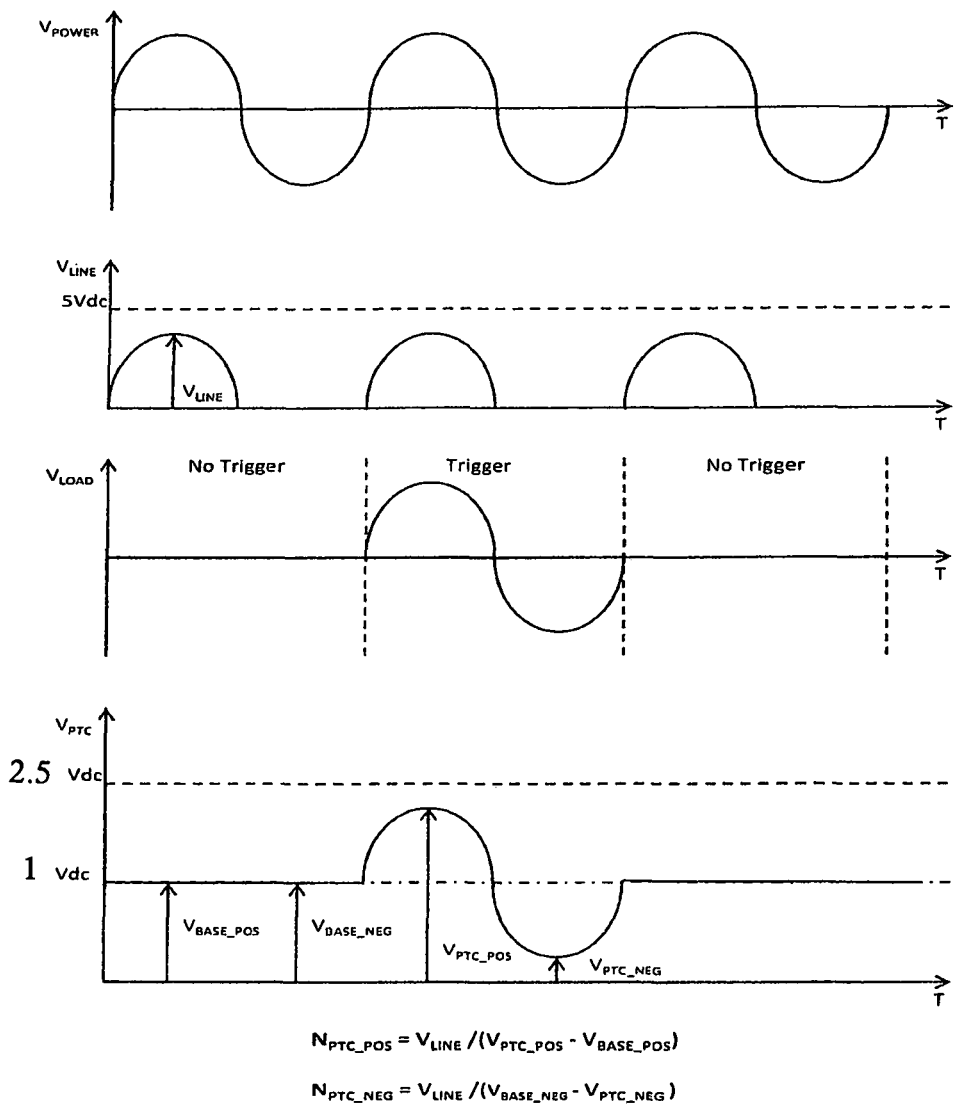
FIG. 13 shows signals produced by the circuit of FIG. 12.

The circuit of FIG. 12 preferably uses an MCU (not shown) that employs an ADC to measure a voltage drop across current sense resistor R6 during the positive and negative half cycles of the AC power line ($V_{PTC\_POS}$ and $V_{PTC\_NEG}$) to a dual circuit heating pad. The MCU also measures the power line voltage scaled down by a voltage divider R9 R10. To increase resolution, in this example, the line voltage $V_{LINE}$ is measured as amplitude of the positive half cycle, taking advantage of the symmetrical nature of the AC power line. The MCU uses the measurements to evaluate heating wire temperature for the positive and negative half cycle operated parts of the heating element independently, as set forth in FIG. 13. Resistance of the positive and negative halves of the heating element is measured as ratios of the power line voltage measurement to the amplitude of a corresponding half cycle measurement of the voltage drop across the current sense resistor. The resulting values, that directly correspond to the temperatures of the positive and negative halves of the heating element, are compared to a preset level, and if the preset level is reached, the heating element part of the corresponding polarity is turned off for the duration of the heating period that immediately follows.

The $V_{BASE\_POS}$ and $V_{BASE\_NEG}$ voltage measurements are taken by the MCU when the triac is off to evaluate proper operation of the positive and negative halves of the triac, and also to remove the power supply ripple effect on the temperature measurements. If either $V_{BASE\_POS}$ and $V_{BASE\_NEG}$ voltage departs from a known DC offset for more than the allowed preset value, then the MCU detects a triac Q2 failure, and activates crowbar circuit Q1 R2 to blow fuse F2 and disconnect the heating element from the power supply. This arrangement provides protection not only from a short in any half of the triac, but also in the event of excessive leakage current through the triac.

The same circuit arrangement can be used with a single circuit heating element comprising PTC wire. In this case, the negative half cycle resistance reading may be additionally used to improve accuracy of the measurement and to assess the condition of the negative part of the AC switch (triac).

The same circuit arrangement can be further used with a multiple circuit heating element comprising PTC wire, where the heating element circuits are sequentially connected (one at a time) to the control circuit for resistance measurements by an additional switching circuit. Through this arrangement, the control circuit may provide condition evaluation for all AC switches in the heating element operation circuitry.

For the non-PTC types of AC powered heating elements, or when other techniques are used to control the heating element temperature, the circuits of FIGS. 2-9, FIG. 11A and FIG. 11B provide positive detection of the AC switch failure for both positive and negative halves of the switching structure.

When no crowbar circuit is available, and/or no logic driven protection circuitry is used, a Duty Cycle Protection method, according to the disclosure, provides adequate protection from a short circuit failure of either part of the AC switching element.

Figure 14:
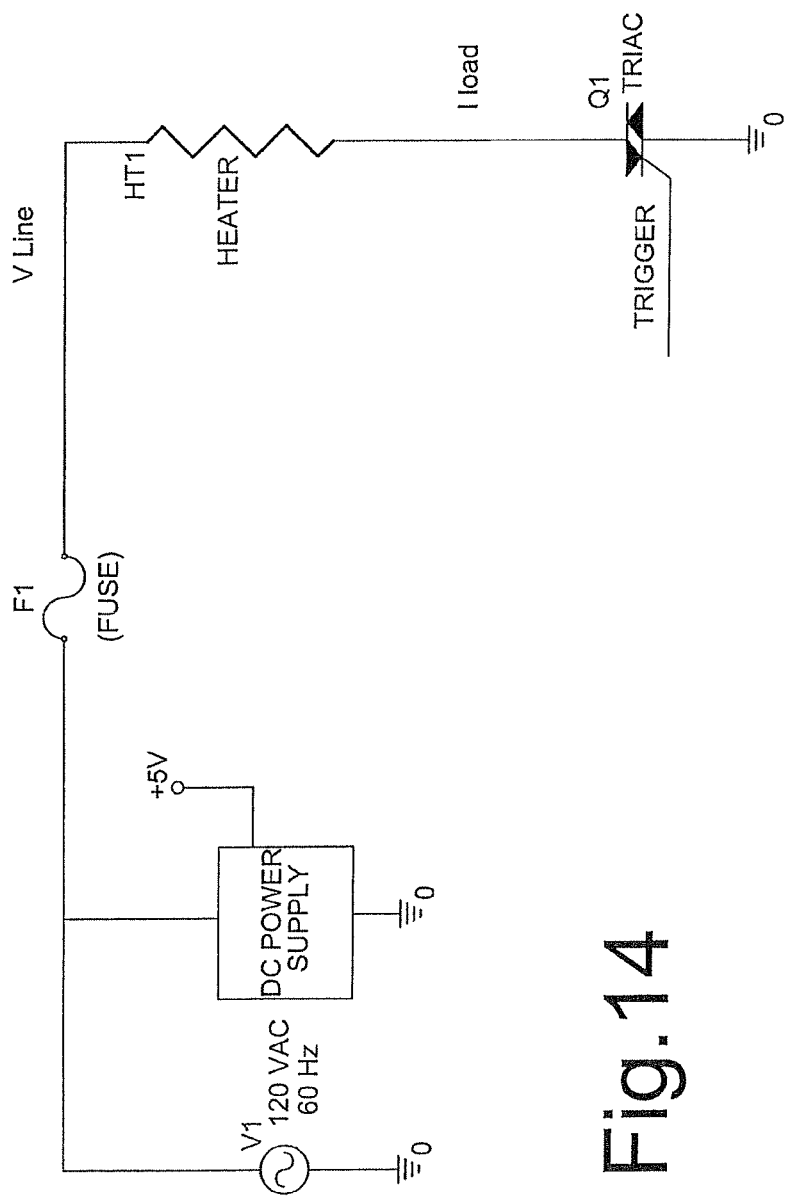
FIG. 14 is a circuit diagram for duty cycle enabled protection responsive to AC switch failure at either half cycle.
Figure 15:
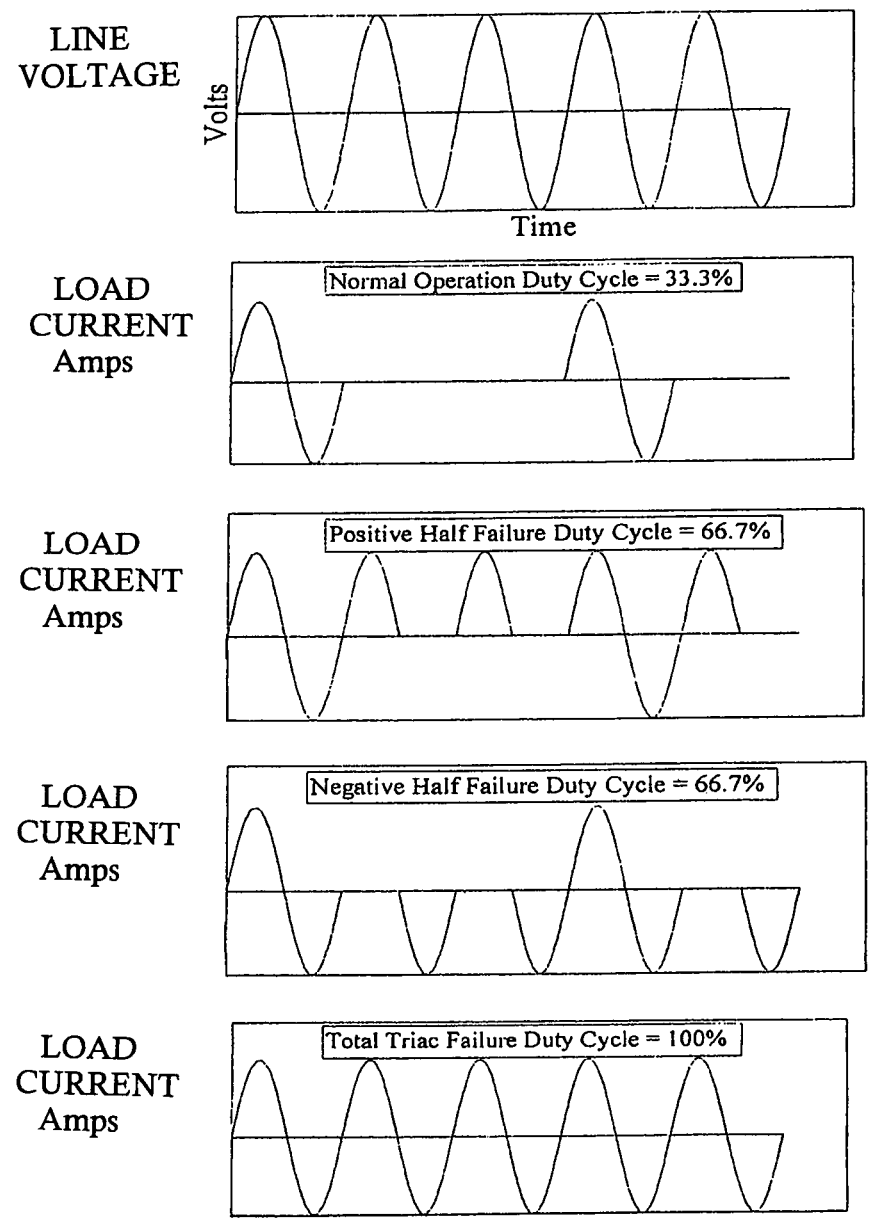
FIG. 15 illustrates signals generated by the circuit of FIG. 14.

In general, Duty Cycle Protection is a passive technique which provides adequate electronic AC switch failure protection without the use of extra active components or sophisticated algorithms. The hardware arrangement is shown in FIG. 14. The principle of operation is demonstrated by diagrams of FIG. 15. More particularly, under normal working conditions, triac Q1 is triggered every third cycle of the power line voltage. Heating element HT1 is constructed so as to provide adequate power at a 33.3% duty cycle. Fuse F1 is sized to allow continuous operation at an average current corresponding to the 33.3% duty cycle, and blow, when the current is exceeded by more than about 15%. If either the positive or negative half of the triac fails due to a short, the average current doubles as the duty cycle goes to 66.7%, and fuse F1 blows. If both halves of the triac fail due to a short, the average current triples, and fuse F1, in turn, blows even faster.

Overall, the bi-polar temperature control and/or AC switch protection mechanisms, as described above, can be used on any AC powered devices, where complete or partial failure of the AC switch may lead to a dangerous situation or undesired performance. Examples of such devices include, but are not limited to, motor controls, light controls, microwave ovens, conventional ovens, etc.

The AC switch may comprise, for instance, a triac, a triac equivalent, a MOSFET AC switch, a thyristor based AC switch, a solid state relay, or any other electronic circuit capable of controlling AC power in response to the control signal.

It is noted that in the above-described circuits, an inductor or a capacitor may be used in place of the resistor to measure current. As known by those skilled in the art, differing sources of impedance would suffice.

Also, it is understood that other arrangements of voltage and current based AC switch failure detection circuits may be employed by those skilled in art to provide detection of the positive and negative halves of the AC switch, without departing from the scope and spirit of this disclosure.

The embodiments herein described are provided for the purpose of illustration and not limitation of the disclosure. Various modifications and alterations may be appreciated based on a review of this disclosure. These changes and additions are intended to be within the scope and spirit of the disclosure as defined by the following claims.

What is claimed is:

1. A safety circuit for use in disrupting power to a heating element of an appliance, the circuit including an AC power source having a positive half cycle and a negative half cycle for delivering power to the heating element, a solid state switch comprising a triac through which the heating element is powered by the AC power source, a bipolar detection circuit for detecting a low resistance condition in said triac during a positive half cycle of AC power through said triac and detecting a low resistance condition in the triac during a negative half cycle of AC power through the triac to generate a fault signal to interrupt power to the heating element whenever the low resistance condition is detected while said triac is not activated, and a microcontroller unit for receiving the fault signal to activate a crowbar circuit to open a fuse, the detection circuit including a selected electronic component for detecting either levels of voltage across or current through said triac during either the positive or negative half cycle of AC power to generate the fault signal to interrupt power to the heating element when either the voltage or current, respectively, through said triac reaches a predetermined level, wherein said bipolar detection circuit includes an NPN transistor switch responsive to the positive voltage drop across said triac and a PNP transistor switch responsive to the negative voltage drop across said triac, said PNP transistor switch connected to the base of said NPN transistor switch and the bases of said transistors connected to the triac so as to actuate said NPN transistor in response to either positive or negative voltage drop across said solid triac, said detection circuit providing a high logical level output to the microcontroller whenever said triac is conducting, and said microcontroller being arranged to generate said fault signal to interrupt power to said heating element if said high logical level is received while said triac is not actuated, whereupon detection by the detection circuit of a short in said triac in either the positive and negative half cycle of AC power and interruption of power to the heating element protects the appliance utilizing the heating element from overheating.

2. The safety circuit set forth in claim 1, said detection circuit detecting the level of current through said triac during either half cycle of the AC power to generate said fault signal to interrupt power to said heating element when said current through said triac reaches a predetermined level.

3. The safety circuit set forth in claim 2, wherein said detection circuit includes a current transformer.

4. The safety circuit set forth in claim 2, said detection circuit including an optocoupler connected across a voltage divider for detecting the level of current through said triac during either half cycle of the AC power to generate a fault signal to interrupt power to said heating element when said current through said triac reaches a predetermined level.

5. The safety circuit set forth in claim 2, said detection circuit including two NPN transistors connected to a load resistor in series with said triac for detecting the level of current through said triac during either half cycle of the AC power to generate said fault signal to interrupt power to said heating element when said current through said triac switch reaches a predetermined level.

6. The safety circuit set forth in claim 2, said detection circuit including inversely parallel diodes connected in series with said triac for detecting the level of current through said triac during either half cycle of the AC power to generate said fault signal to interrupt power to said heating element when said current through said triac reaches a predetermined level.

7. The safety circuit set forth in claim 1, said detection circuit including a voltage divider connected across said triac through a high resistance to generate an analog signal detecting the voltage level of said triac during either half cycle of the AC power to generate said fault signal to interrupt power to said heating element when said voltage falls to a predetermined level, and a converter for said analog signal to deliver a signal to the microcontroller unit to generate said fault signal.

8. The safety circuit set forth in claim 1, said detection circuit including a current divider connected to said triac to generate an analog signal detecting the current level of said triac during either half cycle of the AC power to generate said fault signal to interrupt power to said heating element when said current reaches a predetermined level, and a converter for said analog signal to deliver a signal to the microcontroller unit to generate said fault signal.

* * * * *